United States Patent [19]

Stückler

[11] 4,163,309
[45] Aug. 7, 1979

[54] ARRANGEMENT FOR MOUNTING COMPONENTS ON A CARRIER BOARD AND METHOD OF INDICATING MOUNTING LOCATIONS

[76] Inventor: Gerd Stückler, Finkenweg 2, Brunnthal, Fed. Rep. of Germany, 8011

[21] Appl. No.: 851,830

[22] Filed: Nov. 16, 1977

[30] Foreign Application Priority Data

Apr. 14, 1977 [DE]  Fed. Rep. of Germany ....... 2716548

[51] Int. Cl.² ........................................... H05K 13/04
[52] U.S. Cl. .................................................... 29/407
[58] Field of Search ......................... 29/407, 720, 721; 350/22, 30

[56] References Cited

U.S. PATENT DOCUMENTS

| | | | |
|---|---|---|---|
| 3,548,493 | 12/1970 | Hubbard | 29/407 |
| 3,619,886 | 11/1971 | Sauve et al. | 29/407 |
| 3,706,134 | 12/1972 | Sweeney | 29/407 |

Primary Examiner—Michael J. Keenan
Attorney, Agent, or Firm—Toren, McGeady and Stanger

[57] ABSTRACT

The mounting locations for separable components on a printed circuit board are indicated by a projected luminous spot which is moved sequentially and repeatedly between the several mounting spots for each component. The direction of movement of the luminous dot is changed in each mounting spot. The spot travels over the board in response to an element of the optical system in the projector being moved in a plane parallel to the board surface under control of a programmed unit.

7 Claims, 3 Drawing Figures

ARRANGEMENT FOR MOUNTING COMPONENTS ON A CARRIER BOARD AND METHOD OF INDICATING MOUNTING LOCATIONS

This invention relates to the assembly of circuit boards with separable components, and particularly to a method of indicating mounting locations for the components, wherein each location includes a plurality of mounting spots, and to an arrangement for mounting such components on circuit boards.

It is known to indicate mounting positions on a circuit board by means of a projected luminous arrow. The length and direction of the arrow in the known indicating method can be varied to indicate size and orientation of the component to be mounted. The arrow stands still and may not be detected easily in a brightly lit room and/or among previously mounted components of the board.

An important object of the invention is the provision of a method which indicates a mounting location and the several spots of a mounting location in a manner more readily visible even under unfavorable lighting conditions.

Another object is the provision of a mounting arrangement capable of performing the method and of otherwise facilitating the mounting operation.

It has been observed that a moving luminous dot is more readily detected than stationary luminous indicia of equal luminosity, and as has been found that dimensions and orientation of a component to be mounted are readily indicated by the distance over which the luminous dot travels.

The invention, in one of its more specific aspects, resides in a method of indicating at least one mounting location including a plurality of mounting spots spaced on a surface, which method comprises projecting a luminous dot on the surface, moving the projected dot sequentially and repeatedly between the mounting spots to be indicated, and changing the direction of movement of the dot in each of the spots.

In another aspect, the invention resides in an arrangement for mounting components on a surface of a carrier board in which the carrier board is secured on a support in a precisely defined position. A projector includes an optical system of projecting a luminous dot on the surface of a secured carrier board. Means are provided for moving an element of the optical system in a plane parallel to the surface of the board, and a control unit controls the movement of the optical element in a predetermined sequence.

Other features, additional objects, and many of the attendant advantages of this invention will readily be appreciated as the same becomes better understood from the following detailed description of a preferred embodiment when considered in connection with the appended drawing in which.

Figure 1:
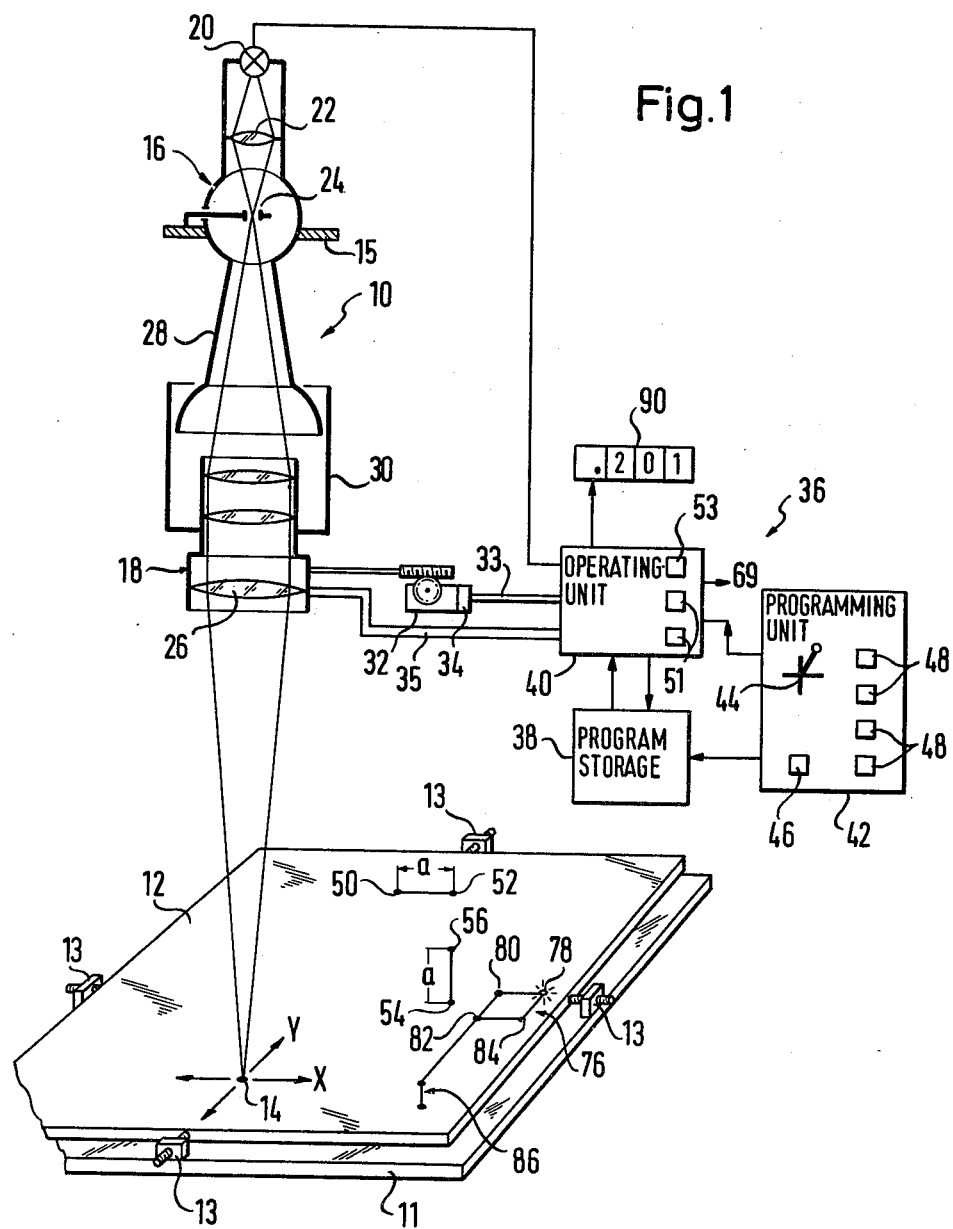
FIG. 1 illustrates a projector of the invention projecting luminous indicia on a circuit board and an associated control system in fragmentary perspective view, partly in section, and by conventional symbols.

Referring initially to FIG. 1, there is shown a projector 10 on whose baseboard 11 a carrier board 12 for electrical components, such as a printed circuit board is precisely positioned by means of four, threaded, locating pins 13. A luminous dot 14 having a diameter of preferably 2.3 mm, but generally 1 to 3 mm diameter, is projected by the optical system of the projector 10 whose externally visible parts include a lamp housing 16 mounted on the baseboard 11 by means of a bracket 15 and a column, not shown, and a lens barrel 18 independently mounted as will presently be described.

The optical system of the projector 10 includes a point light source 20, such as an incandescent electric lamp, a condenser lens 22, an aperture plate 24, and an objective lens system 26. A portion of the housing 15 spherically curved about the aperture in the plate 24 is movably received in a circular opening of the bracket 15 so as to provide a universal joint for tilting movement of the housing 16 in all directions. The beam of light from the lamp 20 is confined in a flaring tube 28 fixedly attached to the housing 16 and received with ample radial clearance in an axially overlapping cylindrical tube 30 attached to the lens barrel 18.

The barrel may be moved in a plane parallel to the surface of the circuit board 12 by two electric stepper motors 32 and associated worm gears, the worms being journaled at right angles to each other in the supporting structure of the projector and carrying the lens barrel 18. Only one motor 32 is shown in the drawing together with a control counter 34 which incidates the position of the spot 14 in the direction of the X-axis, the movement of the lens barrel 18 in the direction of the Y-axis being caused by another, identical motor obscured in the view of FIG. 1, and equipped with a counter.

Conductors 33,35 connect the motors to the operating unit 40 of a control system 36 also including a program storage unti 38 and a programming unit 42. A lever 44 mounted on the programming unit 42 for pivotal manual movement about two perpendicularly intersecting axes permits the spot 14 to be shifted by the operating unit 40 and the connected motors 32 to a desired location on the surface of the circuit board 12, and the location as indicated on the counters 34, may then be entered in the program storage unit 38 by pressing a key 46.

The program storage unit 38 may be provided with interchangeable programs, preferably based on CMOS semi-conductor storage and may have a capacity of 4 to 32,000 bits, the larger number being adequate for indicating the location of up to 700 components.

The operating unit 40 includes a non-illustrated comparator which is fed actual location signals from the counters 34 and nominal location signals from the storage unit 38 to produce an error signal which actuates the motors 32 in the necessary manner to minimize the difference.

After entry of coded information on two spots 50,52 spaced apart a distance a in the X direction by means of the lever 44 and the key 46, as described above, additional, equally spaced spots 54,56 may be entered in the storage unit 38 by manually entering the spot 54, and thereafter pressing one of four direct-setting keys 48, whereupon the spot 56 is entered automatically. The control system 36 is normally line-operated, but may be provided with a back-up battery for protection against line failure.

Adjusting keys 51 in the operating unit 40 permit adjusting the unit for inaccurate positioning of the circuit board 12 on the projector baseboard 11. A stepping key 53 on the operating unit 40 causes the dot 14 to be shifted to the next mounting location.

Figure 2:
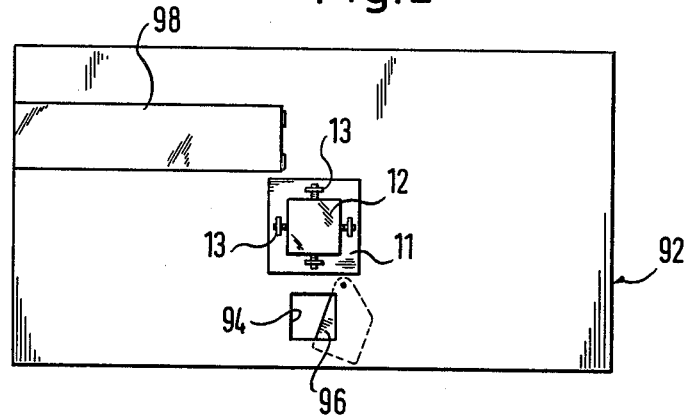
FIG. 2 is a top plan view of elements of the projector of FIG. 1 and of an associated component supply unit.
Figure 3:
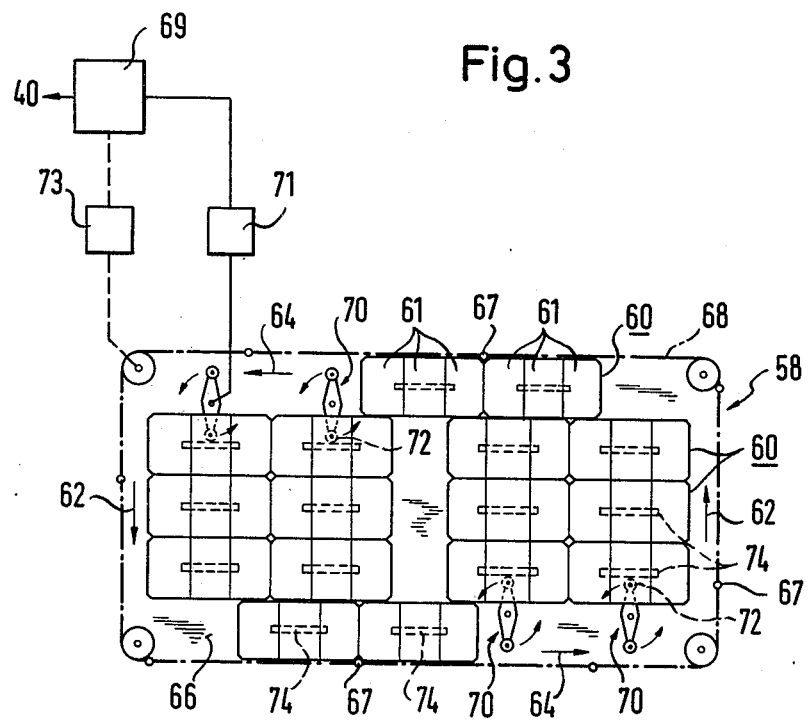
FIG. 3 is a fragmentary top plan view of the supply unit of FIG. 2 without a portion of its housing but with associated drive elements connected to the control system of FIG. 1.

As is shown in FIG. 2, the baseboard 11 of the projector 10, not otherwise illustrated in FIG. 2, is fastened centrally to the rectangular cover 92 of a supply unit 58 for the components to be mounted on the baseboard 12. The supply unit is shown in FIG. 3 without much of its housing which encloses 16 elongated bings or receptacles longitudinally divided into three equal compartments 61. The bins 60 travel on caster-mounted carriers, not shown, in rectangular, loop-shaped paths having sections extending in the direction of arrows 62 transversely to the common direction of elongation of the bins 60 and the unit 58, and longitudinal sections in the direction of arrows 64. The bins 60 are moved on the bottom wall 66 of the housing in the direction of the arrows 64 by engagement with dogs 67 on a drive chain 68 which envelops the paths of the bins 60. The bins are moved transversely away from the chain 68 by projections 72 on two-armed rockers 70 pivotally mounted on the bottom wall 66 and engaging ribs 74 on the underside of each bin carrier between the nonillustrated casters. A 180° turn of a rocker 70 shifts a bin 60 away from the chain 68 by its own width, thereby further shifting the farthest one of a column of three previously shifted bins into the path of the chain 68.

The chain 68 travels in a rectangular loop over four guide pulleys of which at least one is driven by a reversible motor 69 through a unidirectional clutch 73. The eight rockers 70 are driven by the same motor 69 through another unidirectional clutch 71. The motor 69 is energized intermittently, and its direction of rotation is controlled by the operating unit 40 in a synchronization with the motors 32. When the motor 69 rotates forward the chain 68 is driven until the four bins 60 engaged by the dogs 67 in the position of FIG. 3 advance by approximately ⅓ of a bin length, and they are aligned in the direction of the arrows 62 with respective horizontal stacks of three bins after the next step in the same direction. When the motor 69 is energized to rotate backward, only the clutch 71 transmits motion to the rockers 70 which are turned 180° and shift the leading four bins of the respective stacks into positions of engagement with the chain 68.

As is seen in FIG. 2, an opening 94 in the cover 92 gives access to one compartment of a bin 60 stopped thereunder during its movement in the direction of an arrow 64 to present to an operator the component needed for mounting in one location of the board 12, the several terminals of the component being attached to respective receiving terminals in the several mounting stops at the location indicated. When the operator next pushes the key 53, the access opening 94 is temporarily closed by a safety cover 96 in a known manner, not specifically illustrated, while the bin 60 advances by the length of one compartment, and the lens barrel 18 is shifted to indicate the next mounting location. As soon as the chain 68 stops, the cover 96 gives access to a supply of the component to be mounted at the newly indicated location.

A hinged door 98 in the cover 92 permits the contents of the bins 60 to be replenished as may be needed, or to be replaced by other components if different circuit boards are to be assembled. The program no longer suitable for the different assembly operation may be replaced quickly in the unit 38 in a manner known in itself. A read-out 90 on the operating unit 40 may indicate the serial number of the bin compartment 61 aligned with the access opening 94 and may also be utilized for signaling approaching exhaustion of the component supply in the aligned bin.

While the luminous dot 14 indicates the mounting spots 50,52 for the two terminals of a component, such as a resistor or capacitor, it is caused by the program stored in the unit 38 to move back and forth between the two spots. It has been found advantageous to stop the dot at each point of reversal for a period of not less than 0.05 nor more than one second, a dwell time of approximately 0.2 seconds being usually long enough to identify the mounting spot safely without slowing the operator. Visibility of the dot is increased by varying its luminous intensity during the dwell times as by alternatingly turning it on and off. The speed of dot travel between the spots 50,52 may be selected at will. A traveling speed as high as 30 cm/sec. is entirely feasible. Preferably, the dot should scan all mounting spots of the location ofr a component within 0.4 to one second, the actual travel time depending less on the distance of the individual spots than on the number of spots. Four spots 78, 80, 82, 84 may be scanned sequentially in repeated cycles nearer the upper limit of one second than two spots associated with the same mounting location. During travel from one spot to the other within the same mounting location, the dot may be turned off completely. When traveling from the spots 78–84 to a spot 86 at another mounting location, the dot should preferably be bright enough to be visible to the operator. For the comfort of the operator, the dot should travel not faster than approximately 30 cm/sec. to guide the eyes of the operator without conscious effort.

When the distance traveled by the dot 14 exceeds a certain maximum value, the correspondingly moved lens barrel 18 causes the cylindrical tube 30 to engage a flaring skirt at the free end of the tube 28 and thereby to tilt the lamp housing 16 at about the aperture in the plate 24 to maintain adequate luminosity of the dot 14 without impairing the sharp definition of the dot. The tube 30 and tube 28 thus constitute a lost-motion coupling which does not become effective as long as the objective moves within a relatively narrow range. The light source thus does not participate in the quick and short movements of the lens barrel while the dot travels between the several spots of a mounting location, and the life of its filament is greatly lengthened thereby.

It should be understood, of course, that the foregoing disclosure relates to a preferred embodiment, and that it is intended to cover all changes and modifications of the example of the invention herein chosen for the purpose of the disclosure which do not constitute departures from the spirit and scope of the invention set forth in the appended claims.

I claim:

1. A method of indicating at least one mounting location including a plurality of mounting spots spaced on a surface which comprises:
   (a) projecting a luminous dot on said surface;
   (b) moving the projected dot sequentially and repeatedly between the mounting spots to be indicated; and
   (c) changing the direction of movement of said dot in each of said spots.

2. A method as set forth in claim 1, wherein the movement of said dot is stopped in each of said spots for a dwell time of 0.05 to 1 second.

3. A method as set forth in claim 1, wherein the diameter of said dot is between 1 and 3 millimeters.

4. A method as set forth in claim 3, wherein the movement of said dot is stopped in each of said spots for a dwell time of 0.05 to 1 second.

5. A method as set forth in claim 3, wherein the luminous intensity of said dot is modulated cyclically during said dwell time.

6. A method as set forth in claim 1, wherein the luminous intensity of said dot is reduced during movement between said spots.

7. A method as set forth in claim 1 wherein two of said mounting locations are to be indicated, said dot after said moving over the mounting spots of said one location being moved from said one location to the other location while maintaining a luminosity perceptible to the human eye.

* * * * *